United States Patent [19]
Horiuchi

[11] Patent Number: 5,286,664
[45] Date of Patent: Feb. 15, 1994

[54] METHOD FOR FABRICATING THE LDD-MOSFET

[75] Inventor: Tadahiko Horiuchi, Tokyo, Japan

[73] Assignee: NEC Corporation, Tokyo, Japan

[21] Appl. No.: 955,356

[22] Filed: Oct. 1, 1992

[30] Foreign Application Priority Data

Oct. 1, 1991 [JP] Japan .................. 3-253253

[51] Int. Cl.⁵ ........................... H01L 21/265
[52] U.S. Cl. ........................ 437/44; 437/40; 437/29; 437/235
[58] Field of Search ............. 437/44, 40, 29, 56, 437/57, 235

[56] References Cited

U.S. PATENT DOCUMENTS

| | | | |
|---|---|---|---|
| 4,232,327 | 11/1980 | Hsu | 437/44 |
| 4,258,465 | 3/1981 | Yasui et al. | 437/44 |
| 4,597,827 | 7/1986 | Nishitani et al. | 437/44 |
| 4,874,713 | 10/1989 | Gioia | 437/44 |
| 4,956,308 | 9/1990 | Griffin et al. | 437/44 |
| 4,962,054 | 10/1990 | Shikata | 437/45 |
| 5,001,077 | 3/1991 | Sakai | 437/44 |
| 5,043,294 | 8/1991 | Willer et al. | 437/45 |
| 5,198,379 | 3/1993 | Adan | 437/44 |

FOREIGN PATENT DOCUMENTS 0117023 5/1989 Japan ........................... 437/44

*Primary Examiner*—Tom Thomas
*Assistant Examiner*—Tuan Nguyen

[57] ABSTRACT

A process of fabricating an asymmetrical LDD-MOSFET of the type in which a diffused low-doped layer is provided only on the drain side is disclosed. In a MOSFET-formed region, after forming a gate electrode, using a photoresist film covering one sidewall of the gate electrode and the vicinity thereof, ion implantation is performed to form a diffused lightly-doped layer and thereover a silicon dioxide film is selectively grown by the liquid phase deposition technique. In detail, immersion of a concerned wafer in a silicon dioxide-saturated hydrofluosilicic acid aqueous solution while adding boric acid to it brings about the separation and deposition of silicon dioxide film. No deposition onto the surface of the photoresist film takes place. In usual way proceeds formation of a spacer by anisotropic etching, followed by heavily doped source and drain regions. A reduced source parasitic resistance LDD-MOSFET can be easily fabricated.

3 Claims, 11 Drawing Sheets

METHOD FOR FABRICATING THE LDD-MOSFET

BACKGROUND OF THE INVENTION

1. Field of the Invention

This invention relates to a method for fabricating a MOSFET and more particularly to method for fabricating a lightly doped drain (LDD) MOSFET.

2. Description of the Prior Art

In recent years, with larger and larger scale of semiconductor integrated circuit devices (ICs), MOSFETs used as circuit elements have been becoming remarkably scaled down. This however is not simply accompanied by appropriate supply voltage scaling because interfaces between IC circuit devices must be standardized. For the semiconductor ICs therefore are being required device designs for enabling enough prevention of hot carrier effects of causing device degradation and for ensuring the reliability.

In general the LDD-MOSFET structure having a lightly doped (hence electric field-lowered) region between the drain region and the gate electrode is used. In common LDD-MOSFETs, a lightly doped region is formed also between the source region and the gate electrode.

The method for fabricating such a conventional LDD-MOSFET will be described below.

For example, field oxide films are formed by local oxidation on the surface of a p-type silicon substrate. In the thus-isolated area in which a MOSFET is to be built (referred to as MOSFET-formed area hereinafter), a gate oxide film is formed and thereon a polysilicon film as gate electrode is deposited. After gate patterning, lightly-doped source and drain regions are formed by ion implantation. A silicon oxide film is deposited by CVD technique, followed by anisotropic etching, to form sidewall spacers at both sidewalls of the gate electrode. By the second ion implantation, heavily-doped source and drain regions are formed.

With decreasingly lightly-doped source and drain regions for reducing the generation amount of hot carriers, the parasitic resistance associated with the above-mentioned symmetrical LDD-MOSFET becomes greater. The saturation MOSFET-drain current is affected little by the parasitic resistance of the drain region, and greatly by the effective gate voltage drop due to the parasitic resistance of the source region.

Reduction of the on-current because of this can be avoided by implementation of an asymmetrical LDD-MOSFET with a lightly-doped region only at the drain region side of the gate. As an approach for fabricating an asymmetrical LDD-MOSFET by a modified process to the above-mentioned, a concept will instantly emerge that the sidewall spacer on the source side may be removed before ion implantation for forming heavily-doped source and drain regions. This needs an extra etching and the associated mask (such as photoresist film) formation, and hence can not be said to be proper.

Another approach is one that heavy-dose ion implantation previous to forming sidewall spacers is done only on the source side using a mask such as photoresist film formed for it. The formation of a heavily doped drain region is performed after forming sidewall spacers. Therefore, additional photolithography and high-dose ion implantation are needed. For CMOS ICs having come into general use in these days, these processing steps are added in fabrication of n-channel and p-channel MOSFETs, respectively, and thereby the whole process has become complicated.

SUMMARY OF THE INVENTION

It therefore is the object of the present invention to provide a simplified process of fabricating asymmetrical LDD-MOSFETs.

A method for fabricating asymmetrical LDD-MOSFETs according to the present invention comprises the steps of: forming device isolation structures to define a MOSFET-formed region at the surface of a semiconductor substrate; forming a gate insulating film over the surface of the MOSFET-formed region; forming a gate electrode on the gate insulating film; over the MOSFET-formed region, placing a photoresist film provided with a window remaining a local area including only one sidewall of the gate electrode exposed therethrough over the MOSFET-formed region; forming a diffused lightly-doped drain region self-aligned with the exposed sidewall of the gate electrode by ion implantation with a specified impurity at the surface of the semiconductor substrate using the photoresist film and the gate electrode as masks; depositing an insulating film over the exposed surface through the window of the photoresist film; separating and depositing silicon dioxide over the exposed surface through the window; performing anisotropic etching of the insulating film to etch the insulating material including silicon oxide, leaving a spacer at the sidewall of the gate electrode; and after removing the photoresist film, forming a heavily doped drain region self-aligned with the spacer and a heavily doped source region self-aligned with the other sidewall of the gate electrode at the surface of the semiconductor substrate by ion implantation with a specified impurity using the gate electrode and the spacer as masks.

Preferably, the depositing the insulating film is accomplished by immersing a concerned wafer in a silicon dioxide-supersaturated hydrofluosilicic acid aqueous solution.

The selective growth of silicon dioxide is possible at low temperature of up to 40° C.

The photoresist film used as mask to form the lightly-doped region by ion implantation serves also as mask when the insulating film for forming a spacer is deposited, and hence it is only formation of the photoresist film that is needed extra compared with method for fabricating symmetrical LDD-MOSFETs. In the process of fabricating a CMOS IC, ion implantation for building one of n- and p-channel MOSFETs is usually performed with the area of the other built device masked with a photoresist film, it is needed no additional photolithography step.

In this way LDD-MOSFETs with advantages of reduced source parasitic resistance and in turn increased drain current can be simply fabricated, enabling higher operation speeds.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Firstly the liquid phase deposition technique of the silicon dioxide film will be set forth.

To a silicon dioxide-saturated hydrofluosilicic acid ($H_2SiF_6$) aqueous solution, boric acid $H_3BO_3$ is added to a supersaturated state. In this a suitable substrate is immersed, over which silicon dioxide film is deposited. Selective placing of an organic film, such as photoresist film, on the surface of the substrate prevents silicon dioxide from depositing thereon. An example of using soda lime grass as a substrate is described in Japanese Laid-Open Patent Application No. 64-25986. An example of applying the liquid phase deposition technique to the formation of dielectric films in a semiconductor device is seen in the paper: NEC Research & Development, vol. 32(3), pp. 315-322, July 1991".

An experimental example of liquid phase deposition of silicon dioxide will be abstracted from this paper as follows.

Figure 1:
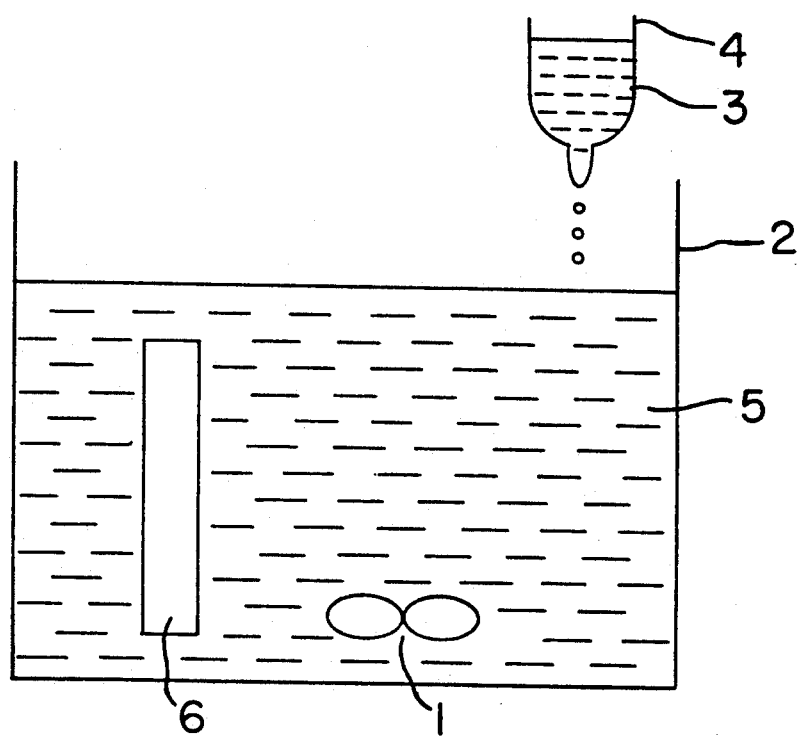
FIG. 1 is a schematic diagram of a liquid phase deposition apparatus employed for an embodiment of the present invention.

High purity silicon dioxide grains were dissolved at 35° C. into a 3.5 mol/litter hydrofluosilicic acid, and filtered off. As shown in FIG. 1, the obtained saturated aqueous solution was placed in a vessel 2 fitted with a stirrer 1. While dropping a boric acid aqueous solution 3 from a dropper 4, a 4 inches size silicon wafer 6 kept immersed under the conditions: temperature of the supersaturated aqueous solution 5 up to 40° C., such as 35° C.; concentration and dropping speed of aqueous boric acid solution 0.1 mol/litter and 10 ml/hr./litter, respectively. Two-hour immersion gave a deposited silicon oxide film of 40 nm-thick and a thickness ununiformity of up to 2%.

An embodiment of the present invention will be detailed below.

Figure 2A:
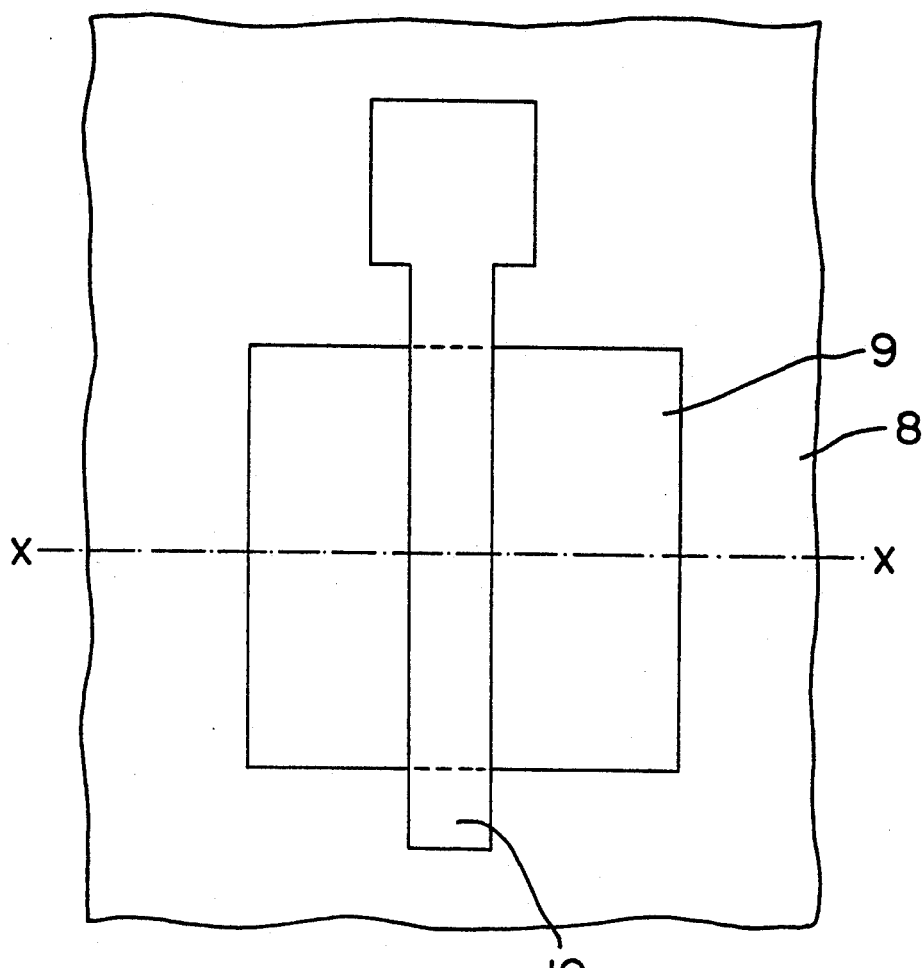
FIG. 2(a) is a plan view of the semiconductor device to explain the embodiment of the present invention.
Figure 2B:
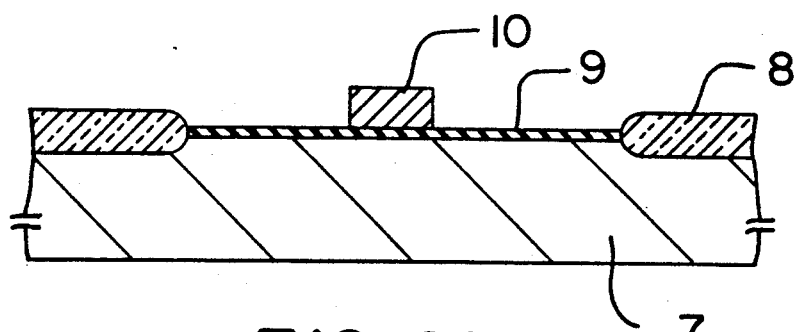
FIG. 2(b) is a sectional view taken along the X—X line of the FIG. 2(a)

Referring to FIG. 2, the surface of a p-type silicon substrate 7 is selectively oxidized to form field oxide films 8 as device isolation structures to define separate n-channel MOSFET-forming areas. On the surface of each area is formed a 13.5 nm-thick gate oxide film 9 over which a 300 nm-thick polysilicon film is deposited. After subsequent patterning, a gate electrode 10 of 0.35 μm in length is obtained.

Figure 3A:
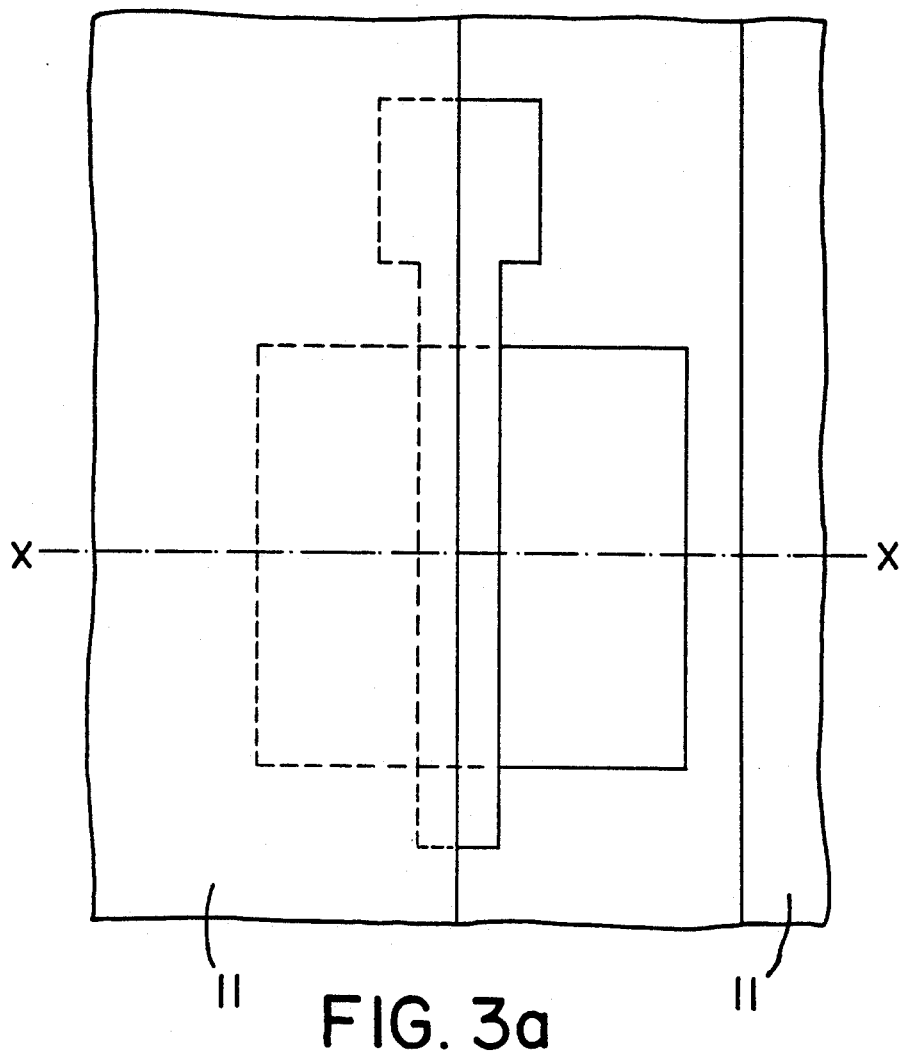
FIG. 3(a) is a plan view to explain the following processing step of FIG. 2(a)
Figure 3B:
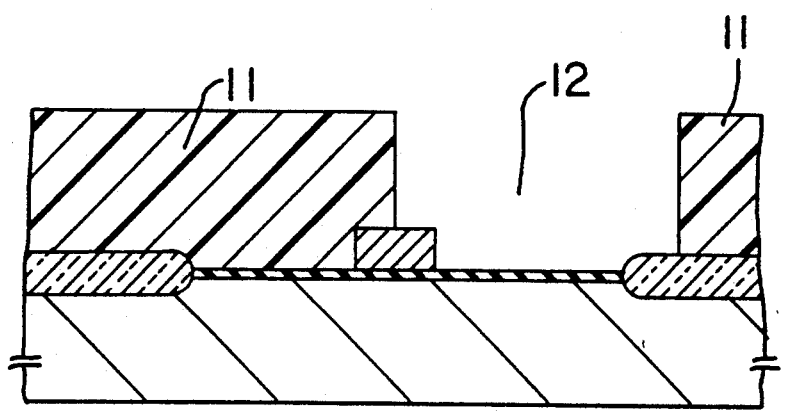
FIG. 3(b) is a sectional view taken along the X—X line of the FIG. 3(a)

Referring to FIG. 3, a positive type photoresist film 11 is formed which has an window 12 taking up about ½ the n-channel MOSFET-forming area.

Figure 4A:
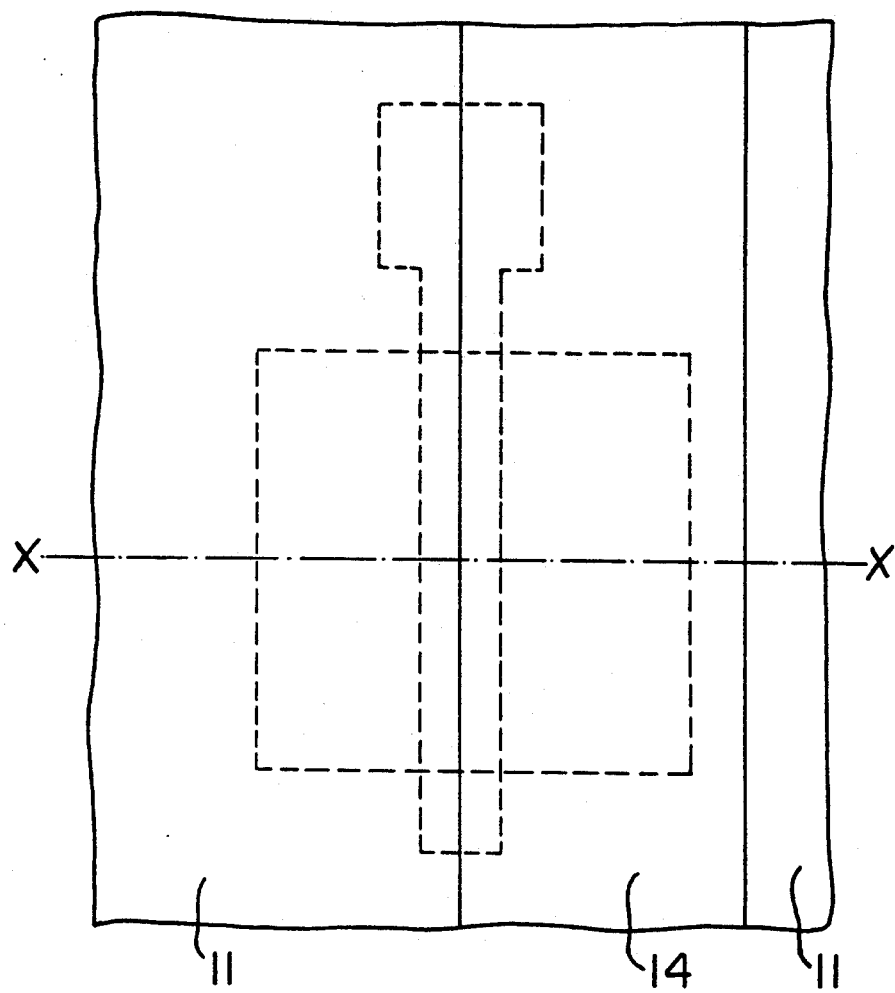
FIG. 4(a) is a plan view to explain the following processing step of FIG. 3(a)
Figure 4B:
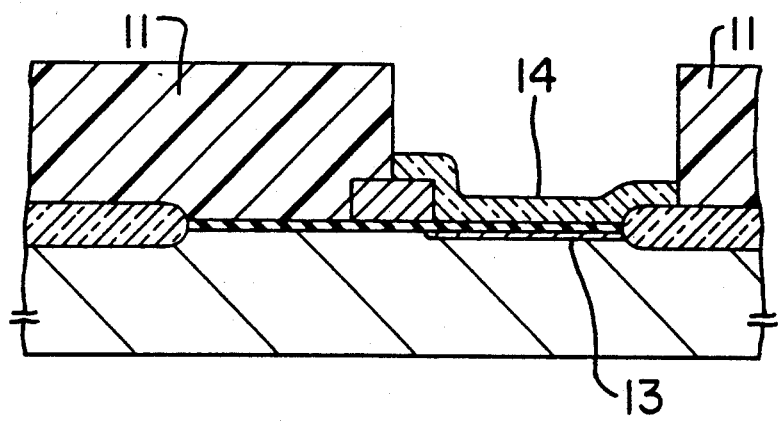
FIG. 4(b) is a sectional view taken along the X—X line of the FIG. 4(a)

Referring to FIG. 4, ion implantation with phosphorus at a dose of $1 \times 10^{13}$ cm$^{-2}$ is performed to form a lightly-doped region 13 of phosphorus-injected layer is formed. The thus-processed wafer is immersed in the aqueous solution of the aforesaid silicon dioxide-supersaturated hydrofluosilicic acid to deposit a 200 nm-thick silicon dioxide film 14 only onto the exposed surface through the window of the photoresist film.

Figure 5A:
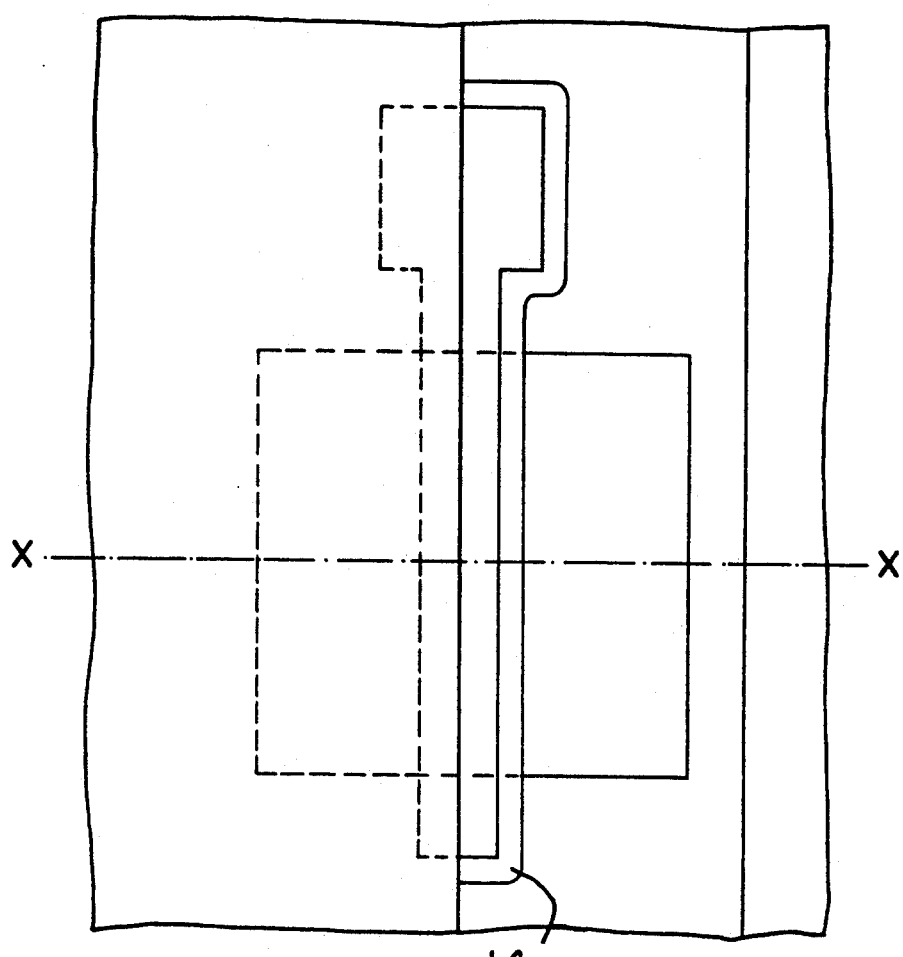
FIG. 5(a) is a plan view to explain the following processing step of FIG. 4(a)
Figure 5B:
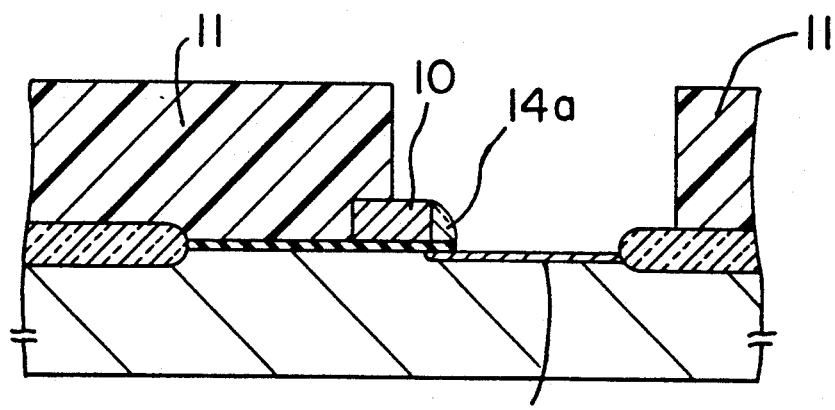
FIG. 5(b) is a sectional view taken along the X—X line of the FIG. 5(a)

Referring to FIG. 5, anisotropic etching is performed using the reactive ion etching to form a spacer 14a at one sidewall of gate electrode 10. These processing steps including formation of lightly-doped region of phosphorus-injected layer, deposition of silicon dioxide film 14, and formation of spacer 14a need one photolithography step of forming photoresist film 11. In the process of fabricating the conventional symmetrical LDD-MOSFET for the manufacture of a CMOS IC, it is needed to cover with photoresist film the p- or n-channel MOSFET-forming area for ion implantation thereinto. Comparison between both reveals there is no additional photolithography step.

Figure 6A:
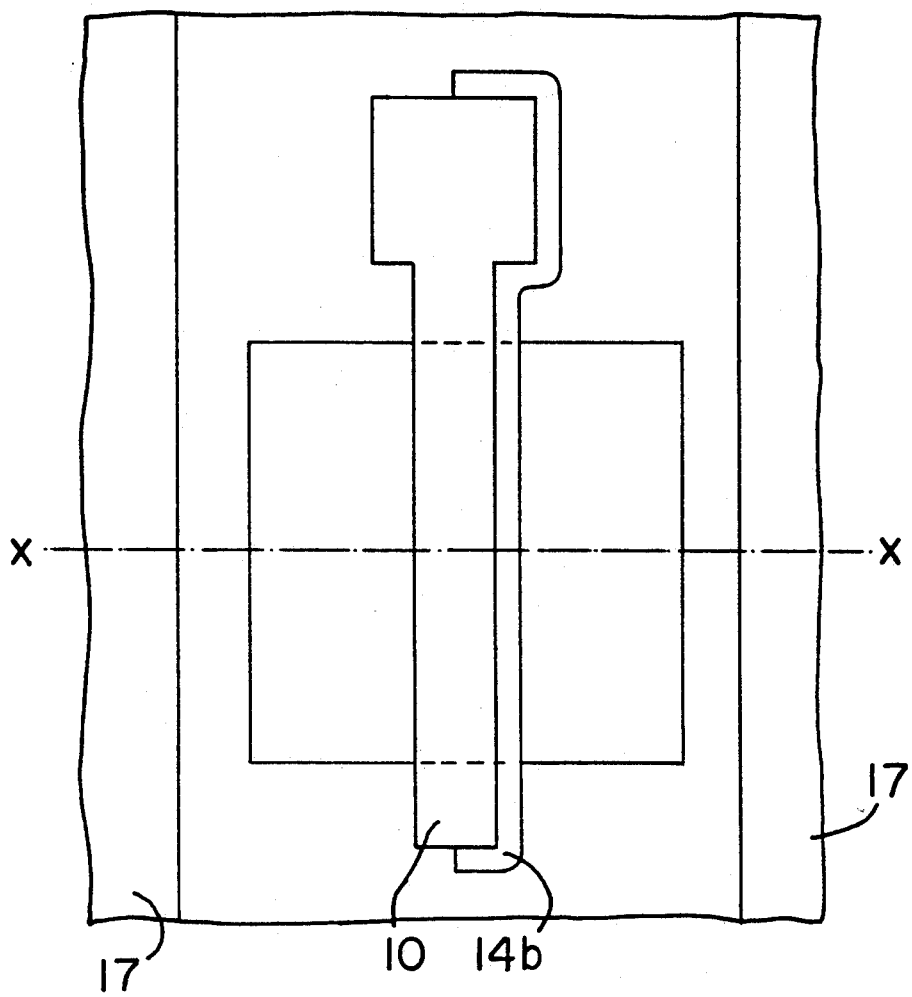
FIG. 6(a) is a plan view to explain the following processing step of FIG. 5(a)
Figure 6B:
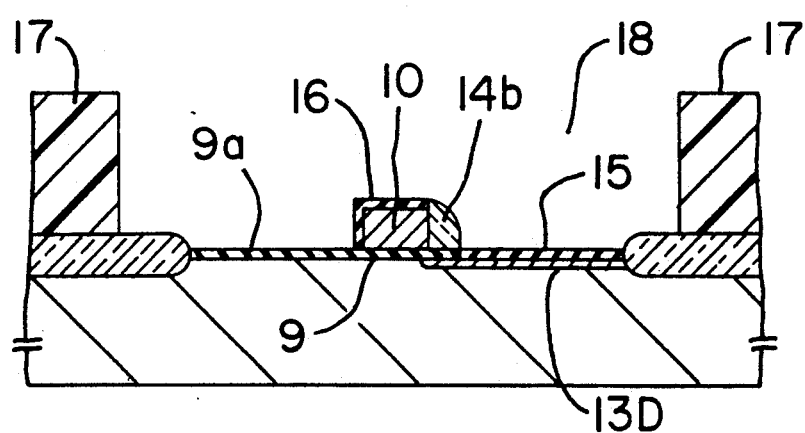
FIG. 6(b) is a sectional view taken along the X—X line of the FIG. 6(a)
Figure 7A:
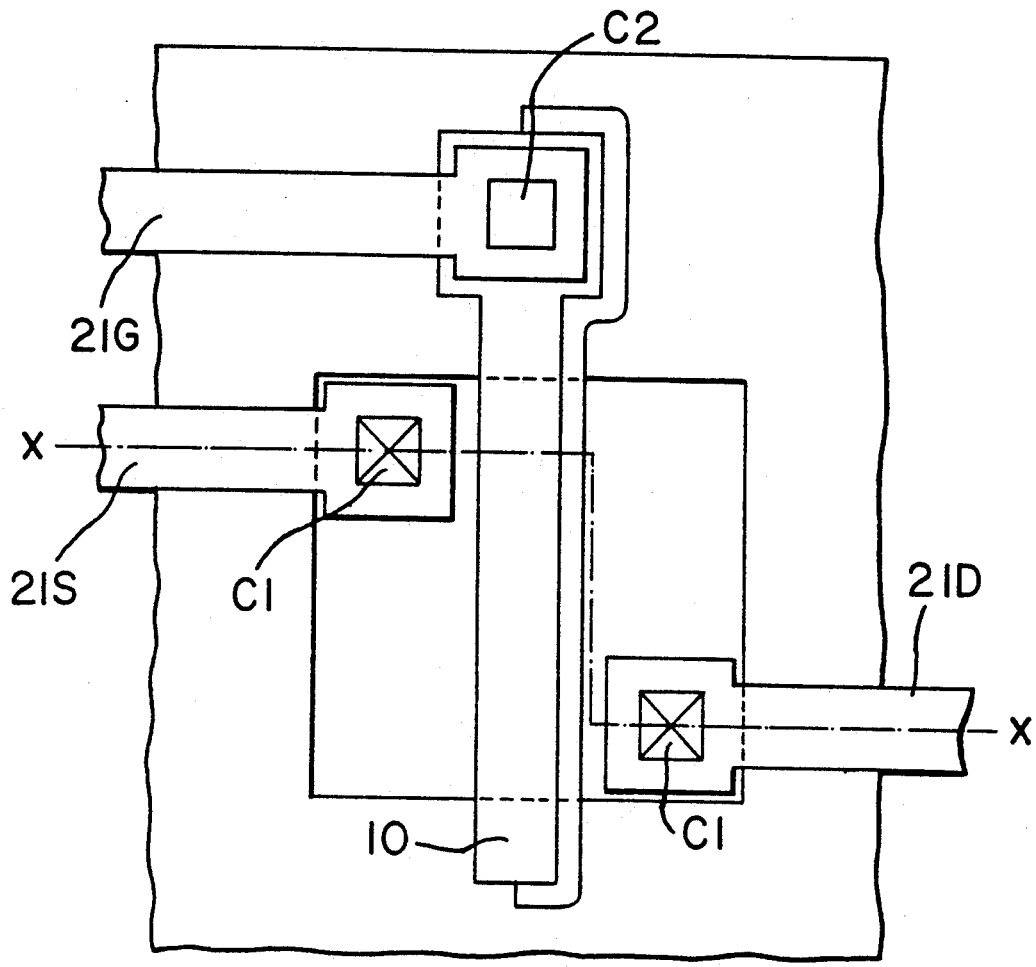
FIG. 7(a) is a plan view to explain the following processing step of FIG. 6(a)
Figure 7B:
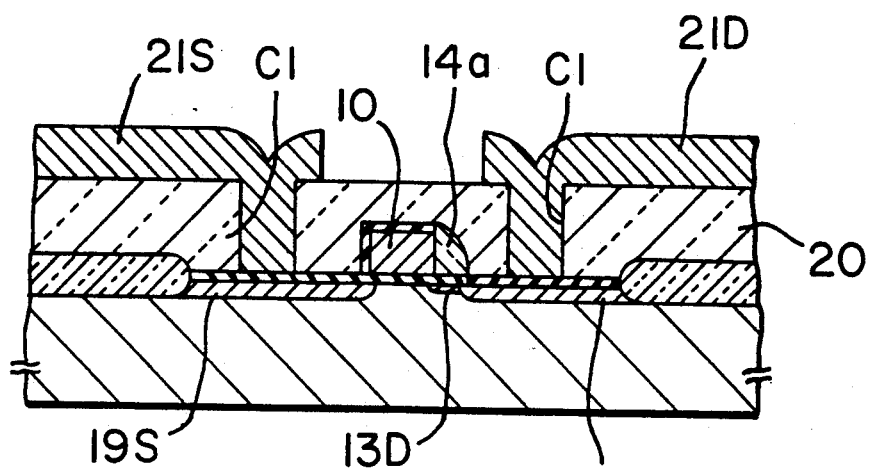
FIG. 7(b) is a sectional view taken along the X—X line of the FIG. 7(a)

Referring to FIG. 6, the photoresist film is removed, followed by thermal treatment to again form a silicon oxide film 15 of about 10 nm thick on the surface of phosphorus-injected layer 13 which has been exposed on the spacer formation. Simultaneously a silicon oxide film 16 is formed also on the surface of gate electrode 10, accompanied by somewhat thickening of gate oxide film 9a except the area covered with gate electrode 10, and by that of spacer 14b. FIG. 6b shows this in exaggerated way. Phosphorus-injected layer 13 is activated to a diffused n⁻ layer 13D. After forming a photoresist film 17 having a window 18 corresponding to the n-channel MOSFET-forming area (the p-channel MOSFET-forming area is covered for CMOS), referring to FIG. 7, ion implantation with arsenic is performed to form n⁺ source region 19S and n⁺ drain region 19D, and then a dielectric film 20 is deposited. Contact holes C1 extending to n+ source region 19S and n+ drain region 19D, respectively, and a through hole C2 extending to gate electrode 10 are cut, and Al—Si—Cu alloy films are deposited in them, followed by patterning, to form source lead layer 21S, drain lead layer 21D and gate lead layer 21G.

Figure 8:
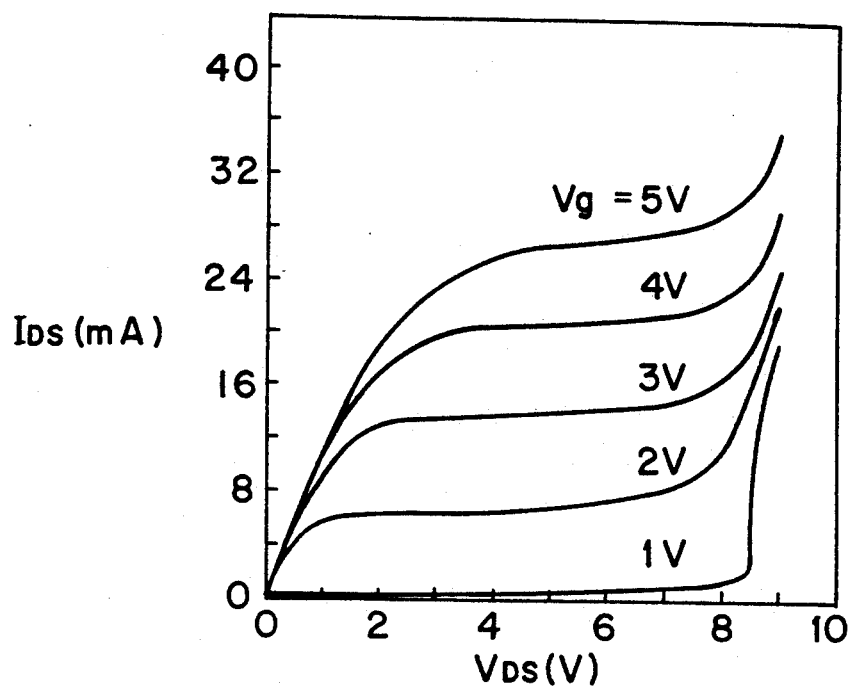
FIG. 8 is a graph of the drain current-voltage characteristics of an asymmetrical LDD-MOSFET according to the present invention.
Figure 9:
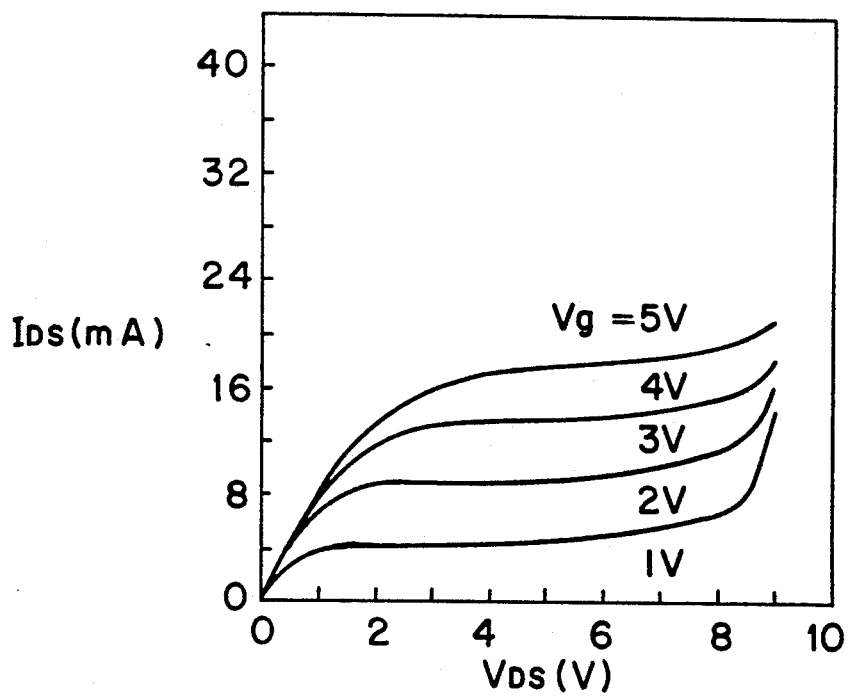
FIG. 9 is a graph of the drain current-voltage characteristics of a symmetrical LDD-MOSFET.

FIG. 8 shows the drain voltage $V_{DS}$ vs. current $I_{DS}$ characteristics of the 50 μm-channel width asymmetrical LDD-MOSFET fabricated in the embodiment detailed above. FIG. 9 shows those of the symmetrical device having the same size. These graphs demonstrates about 45% increment in saturation currents and almost the same in snap back voltages.

Figure 10:
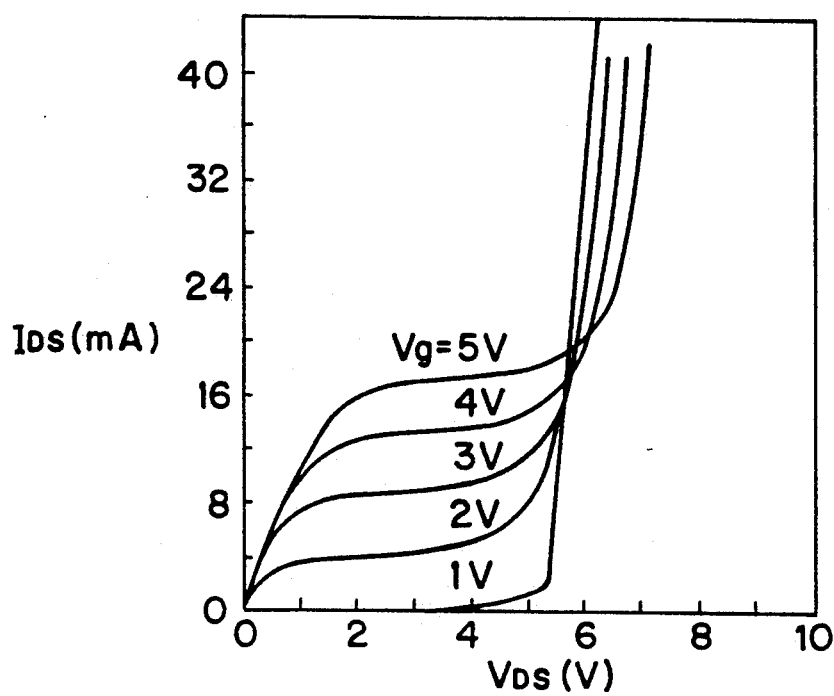
FIG. 10 is a graph of the drain current-voltage characteristics of an asymmetrical LDD-MOSFET in working of the diffused lightly-doped layer as source.

FIG. 10 shows the voltage vs. current characteristic of the asymmetrical LDD-MOSFET with the side having diffused n− layer 13D grounded and with the other side supplied with a positive voltage (reverse mode). The saturated currents are almost the same as in the case of FIG. 9 while the snap back voltages are lower.

Figure 11:
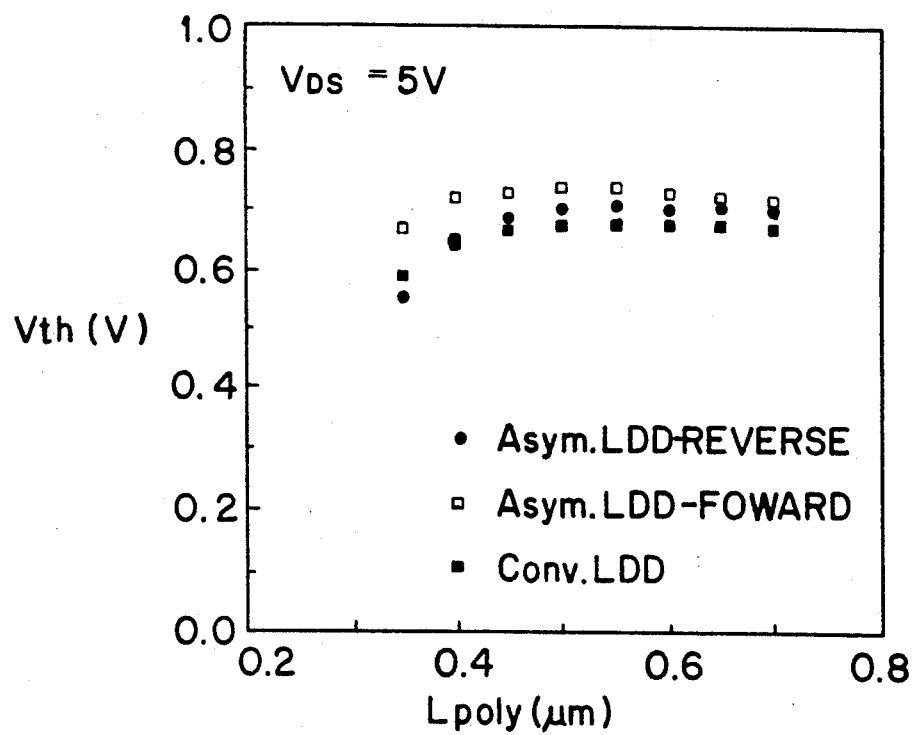
FIG. 11 is a graph of comparison in short channel effects between the asymmetrical LDD-MOSFET according to the present invention and the conventional symmetrical LDD-MOSFET.

FIG. 11 shows an example of the relationship between gate length $L_{poly}$ and threshold voltage $V_{th}$. The same short channel effect is seen by asymmetrical LDD-MOSFET (open square) according to the present invention and the symmetrical LDD-MOSFET (closed square). Remarkable channel effect is seen by the asymmetrical LDD-MOSFET of reverse mode because, owing to lacking any diffused low-doped layer in the drain region, the depletion layer expands from drain region towards channel region.

Figure 12:
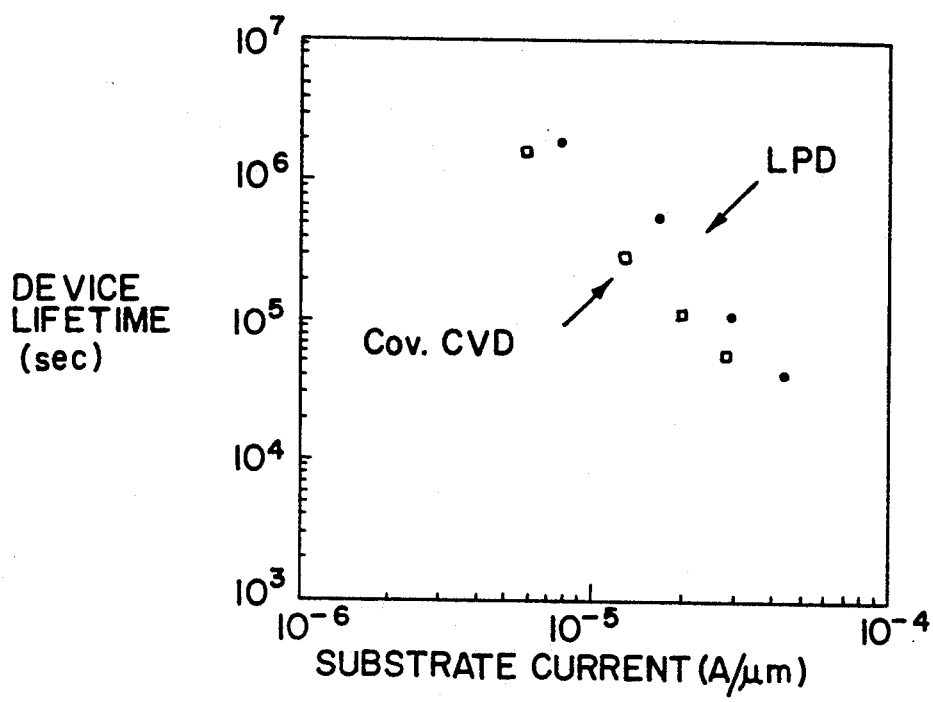
FIG. 12 is a graph showing the substrate current to life span relationship in comparison between symmetrical LDD-MOSFETs using different methods of forming spacers.

FIG. 12 shows dependence of the life span given as time taken for threshold voltage to rise by 100 mV on the substrate current per channel width of 1 μm, as a comparison example of hot carrier degradation between symmetrical LDD-MOSFET having a spacer silicon oxide film formed by CVD and LPD methods, respectively, under the conditions: spacer thickness 150 nm and phosphorus dose for forming the diffused n− layer $4 \times 10^{13}$ cm$^{-2}$. The LPD method provides twice longer life span because it may be considered that the LPD silicon oxide film contains fluorine, which makes electron trapping difficult.

Figure 13:
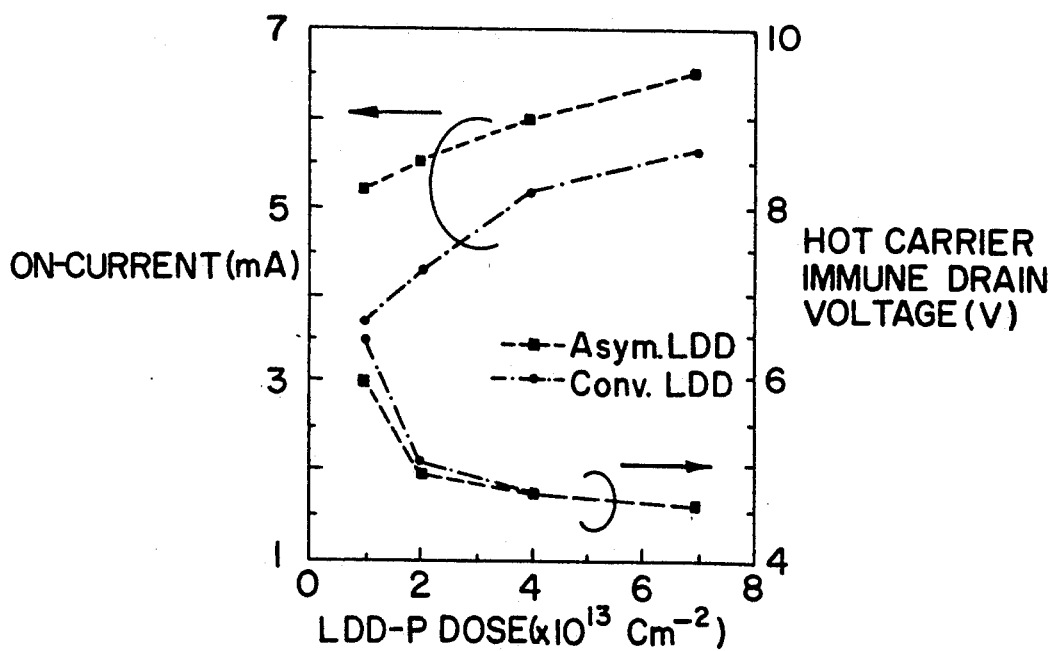
FIG. 13 is a graph showing the dependence of the on-current on phosphorus dose for forming the diffused low-doped layer in comparison between different types of LDD-MOSFET.

FIG. 13 is a graph showing with a LDD-MOSFET the dependences of on-current and hot carrier immunity, respectively, on phosphorus dose for forming the diffused n− layer. The parameters are gate length 0.45 μm, gate width 10 μm, gate oxide film thickness 13.5 nm, and spacer thickness 200 nm. The on-current is a drain current at gate voltage 5 V and drain voltage 5 V. The hot carrier immunity is defined as the drain voltage at gate voltage 2 V and at substrate current 5 μA per channel width 1 μm. Closed square marks are for asymmetrical LDD-MOSFET and closed circle marks for symmetrical LDD-MOSFET. With decreasing phosphorus dose, the on-current of symmetrical LDD-MOSFET reduces sharply and that of asymmetrical LDD-MOSFET decreases slowly. Lower phosphorus dose level results in relatively longer channel length and less on-current. The former is considerable to be because of being affected by the increase of source resistance. The slightly low hot carrier immunity of asymmetrical LDD-MOSFET is because of collision ionization keeping pace with channel electron density becoming higher at constant drain voltage. The hot carrier immunity at a phosphorus dose of $1.5 \times 10^{13}$ cm$^{-2}$ is usable value at supply voltages of $5 \pm 0.5$ V, and the on-current 5.3 mA is proper value from the viewpoint of scaling.

It is understood from the above description that the present invention enables to form a 5 V supply voltage operable n-channel MOSFET of about 0.45 μm gate length.

Figure 14:
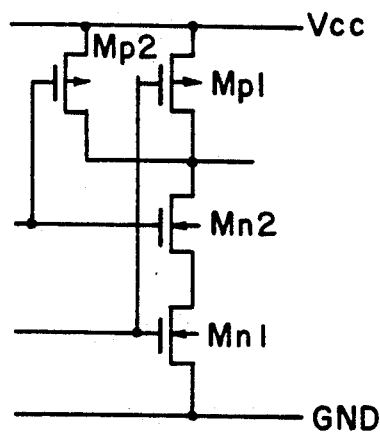
FIG. 14 is a circuit diagram of a CMOS NAND gate using n-channel MOSFETs of the embodiment of the present invention.

FIG. 14 shows an example of using n-channel MOSFETs fabricated by the process of the present invention as circuit elements of a 2-input NAND gate. p-channel MOSFETs Mp1, Mp2 are not of LDD structure but common transistors, and n-channel MOSFETs Mn1, Mn2 are of the asymmetrical LDD structure with a spacer formed on the drain side.

An example to which the above-described embodiment is applied will be set forth.

Figure 15:
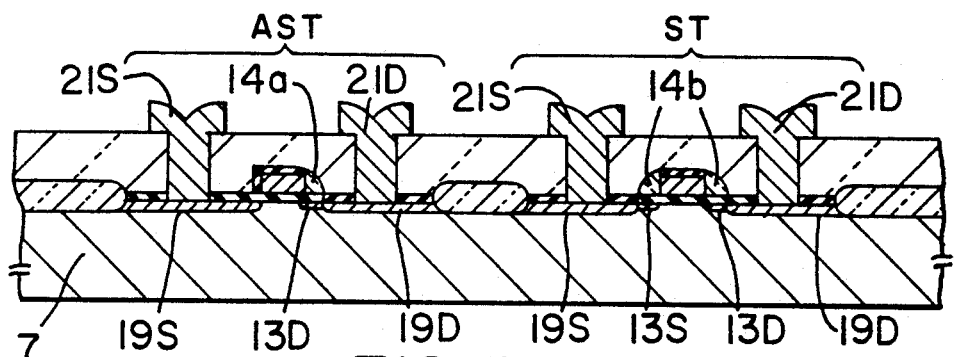
FIG. 15 is a cross-sectional view illustrative of the first application example of the embodiment of the present invention.

In some ICs, for example, with respect to transfer gate of memory cell, it is impossible to specify either from a pair of source and drain regions of a MOSFET as source or drain region. In this case, the use of asymmetrical LDD-MOSFETs is unfavorable. It therefore would be favorable if the pair of asymmetry LDD-MOSFET AST and symmetry LDD-MOSFET ST is formed on the same semiconductor chip as shown in FIG. 15. This can be achieved by application of the present invention as in the following way; a photoresist film provided with a window in the AST-formed region as shown in FIG. 3, and a window through which at least both sidewalls of gate electrodes are exposed in the ST-formed region is formed. Using this photoresist film, ion implantation with phosphorus is performed to form diffused n− layers 13S and 13D, followed by selective growth of silicon oxide film by LPD technique, and anisotropic etching to form an AST spacer 14a and ST spacers 14b.

Another example to which the above-described embodiment is applied will be set forth.

The hot carrier effects in the p-channel MOSFET are not so great as those in the n-channel MOSFET. Implementation of n- and p-channel LDD structures both of the same spacer thicknesses results at the expense of the drain current of the p-channel MOSFET. It is unavoidable, taking it into consideration that a spacer oxide film can be performed by CVD technique with difficulty of selective growth. The present invention permits n- and p-channel MOSFETs to have independently the respective spacer thicknesses.

Figure 16:
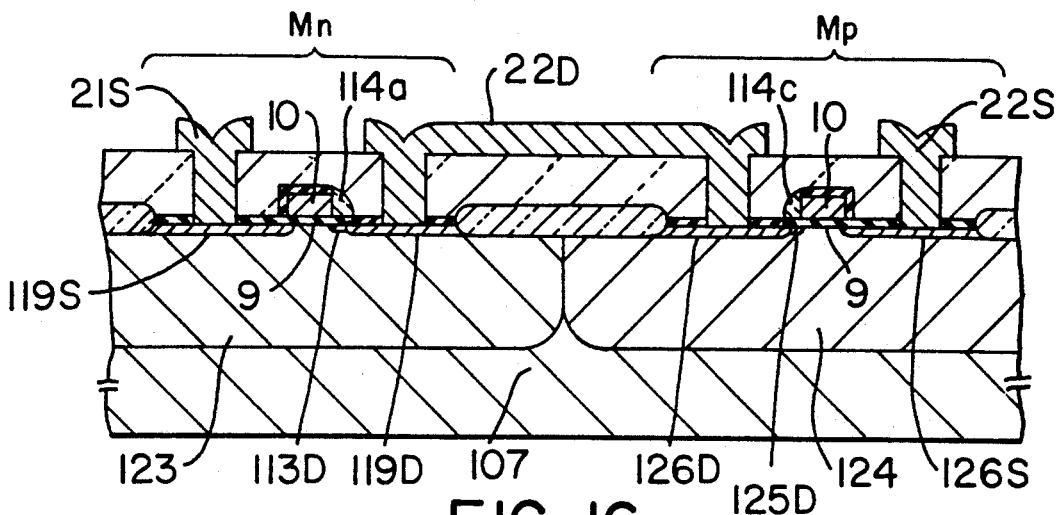
FIG. 16 is a cross-sectional view illustrative of the second application example of the embodiment of the present invention.

Referring to FIG. 16, at the surface of a p-type silicon substrate 107, p- and n-wells 123, 124 are formed, and in each a n-channel MOSFET Mn and p-channel MOSFET Mp are built, respectively, in the following procedure: In the MOSFET-formed area of each well are formed a gate oxide film 9, followed by a gate electrode. In the same way as described with reference to FIGS. 3 to 6, a diffused n− layer 113D of the n-channel MOSFET is formed. A spacer 114a is formed to be 200 nm thick. With the p-channel MOSFET-formed region remaining covered with the photoresist film as mask for ion implantation for forming the diffused n− layer 113D, light thermal treatment is performed to form a silicon oxide film. Subsequently in almost the same procedure a diffused p− layer 125D is formed. Spacer 114C is formed to be 100 nm thick. It is boron ions that is implanted. After again applying light thermal treatment, ion implantation with arsenic and boron difuloride, respectively, is performed using a photoresist film as mask to form n+ drain and source regions 119D, 119S, and p+ drain and source regions 126D, 126S, respectively. In this way, it is possible to reduce the spacer thickness of the p-channel MOSFET and to reduce the parasitic resistance of the diffused p− layer.

Furthermore instead of polysilicon film making up the gate electrode in the above-described example, anyone of films made from suitable materials including high melting point metals, such as tungsten, silicides and polycides can be used.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the scope of the invention.

What is claimed is:

1. A method for fabricating an asymmetrical LDD-MOSFET, comprising:

providing a semiconductor substrate;

forming device isolation structures to define a MOSFET-formed region at a surface of the semi-conductor substrate;

forming a gate insulating film on said surface at said MOSFET-formed region;

selectively forming on said gate insulating film, a gate electrode which has a top surface and two sidewalls;

forming over said MOSFET-formed region an organic insulating film having a window which exposes one side-all of said gate electrode and at least a part of said top surface thereof, said organic insulating film being formed so that it covers another sidewall of said gate electrode and a remaining part of said top surface thereof;

forming at said surface of said semiconductor substrate a lightly-doped drain region self-aligned with said one sidewall of said gate electrode by an impurity introduction using said organic insulating film and said exposed part of said top surface of said gate electrode as masks;

depositing an inorganic insulating film only within said window so that said inorganic insulating film covers said exposed part of said top surface of said gate electrode, said one sidewall of said gate electrode and said gate insulating film at said window;

forming a spacer at said one sidewall of said gate electrode by etching anisotropically said inorganic insulating film and thereby removing said inorganic insulating film from said exposed part of said top surface of said gate electrode;

removing said organic insulating film; and after removing said organic insulating film, forming at said surface of said semiconductor substrate a highly-doped drain region self-aligned with said spacer and a source region self-aligned with said another sidewall of said gate electrode by an impurity introduction using said gate electrode and said spacer as masks.

2. The method for fabricating an asymmetrical LDD-MOSFET as claimed in claim 1, wherein said depositing an inorganic insulating film only within said window is accomplished in accordance with the selective liquid phase deposition technique by immersing a wafer in an aqueous solution of a silicon dioxide-supersaturated hydrofluorosilicic acid, accompanied by separation and deposition of silicon dioxide over an exposed surface through said window.

3. The method for fabricating an asymmetrical LDD-MOSFET as claimed in claim 1, wherein said organic insulating film is a photoresist film.

* * * * *